US006429674B1

(12) United States Patent
Barth et al.

(10) Patent No.: US 6,429,674 B1
(45) Date of Patent: Aug. 6, 2002

(54) PULSE CIRCUIT

(76) Inventors: Jon E. Barth; John R. Richner, both of 1300 Wyoming St., Boulder City, NV (US) 89005-2718

( * ) Notice: Subject to any disclaimer, the term of this patent is extended or adjusted under 35 U.S.C. 154(b) by 0 days.

(21) Appl. No.: 09/561,312

(22) Filed: Apr. 28, 2000

Related U.S. Application Data

(60) Provisional application No. 60/131,630, filed on Apr. 28, 1999.

(51) Int. Cl.[7] .............................................. G01R 31/02
(52) U.S. Cl. ....................... 324/763; 324/765; 324/676; 324/678; 333/20
(58) Field of Search .................................. 324/763, 765, 324/158.1, 602, 637, 676, 678; 333/20

(56) References Cited

U.S. PATENT DOCUMENTS

| 5,410,254 A | * | 4/1995 | Consiglio | ................... | 324/456 |
| 5,519,327 A | | 5/1996 | Consiglio | | |
| 5,786,689 A | * | 7/1998 | Kimura | ................... | 324/158.1 |
| 5,804,977 A | * | 9/1998 | Consiglio | ................... | 324/678 |

OTHER PUBLICATIONS

T. J. Maloney & N. Khuranr (Intel Corp), "Transmission Line Pulsing Techniques For Circuit Modeling of ESD Phenomena" no month/year available.
T. P. Chen, R. Chan, S. Fung & K.F. Lo, "Reproducibility of Transmission Line" no month available.
Horst Giesr, Markus Haunschaild, "Very Fast Transmission Line Pulsing of Integrated Structures and The Charged Device Model" no month available.
Ajith Amerasekera, Leo Van Roozendaal, Juerg Abderhalden, Joop Bruines, Leo Sevat, "An Analysis of Low Voltage ESD Damage in Advanced CMOS Processes" no month available.

Guido Notermans, "On the Use of N–Well Resistors for Uniform Triggering of ESD Protection Elements" no month available.
David M. Zacker, "New Charged–Plate Monitor Design Offers Greater Flexibility" no month available.
Kueing–Long Chen, "Effects of Interconnect Process and Snapback Voltage on The ESD Failure Threshold of NMOS Transistors" no month available.
D. G. Pierce, W. Shiley, B. D. Mulcahy, KE. Wagner and M. Wunder, "Electrical Overstress Testing of 256K UVEPROM to Rectangular and Double Exponential Pulses 1" no month available.
Michael A. Bridgewood and Yujun Fu, A Comparison of Threshold Damage Process in Thick Field Oxide Protection Devices Following Square Pulse and Human Body Model Injection no month available.
Ajith Amerasekera, Charvaka Duvvury, "The Impact of Technology Scalng on ESD Robustness and Protection Circuit Design" no month available.
T. Polgreen and A Chatterjee, "Improving the ESD Failure Threshold of Silicided in MOS Output Transistors By Ensuring Uniform Current Flow" no month available.
Fred Kuper, Jan Marc Luchies, Joop Bruines, "Suppression of Soft Failure in a Submicron CMOS Process" no month available.

(List continued on next page.)

Primary Examiner—Michael J. Sherry
Assistant Examiner—Minh N. Tang
(74) Attorney, Agent, or Firm—Kenehan & Lambertsen, Ltd.; John C. Lambertsen

(57) ABSTRACT

A pulse generator generates a pulse that is transmitted to a device under test through a signal path that has a substantially constant impedance along its entire length. A voltage on the signal path and a current therethrough is measured in response to the pulse being generated.

26 Claims, 2 Drawing Sheets

OTHER PUBLICATIONS

Chrisian Russ, Karlheinz Bock, Mahmound Rasras, Ingrid De Wolf, Guido Goeseneken and Herman E. Maes, "Non-Uniform Triggering of gg–nMOSt Investigated by Combined Emission Micrscopy and Transmission Line Pulsing" no month available.

Chrisian Russ, Horst Gieser, Koen Verhaege, "ESD Protection Elements During HBM Stress Tests–Further Numerical and Experimental Results (ref, p. 96)" no month available.

Wolfgang Stadler, Xaver Guggenmos, Petr Egger, Horst Gieser and Christian Musshoff, "Does the ESD–Failure cureent obtain by Transmission–Line Pulsing always correlate to Human Body Model Tests" no month available.

H. A. Gieser, P. Egger, "Influence of Tester Parasitics on Charged Device Model–Failure Thresholds" no month available.

Timothy J. Maloney, "Enhanced P+ Substrate Tap Conductance in The Presence of pf NPN Snapback" no month available.

S Dabral and TJ Maloney, Pub. J. Wiley pp. 281–197, "Basic ESD I/O Design" no month/year available.

A. Amerasekera & Duvvury Pub. J. Wiley pp. 19–27, "ESD in Silicon Intergrated Circuits" no month/year available.

* cited by examiner

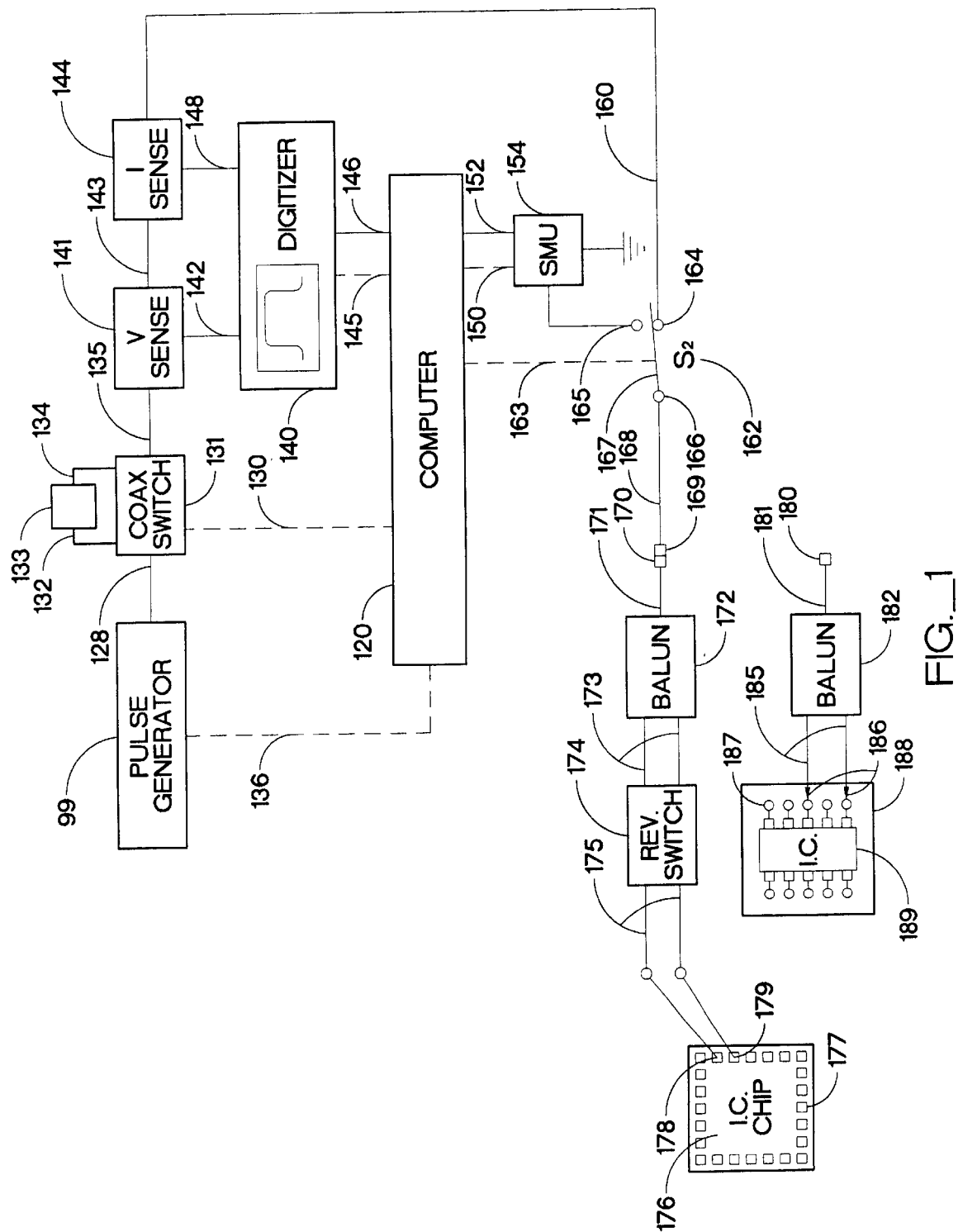
FIG._1

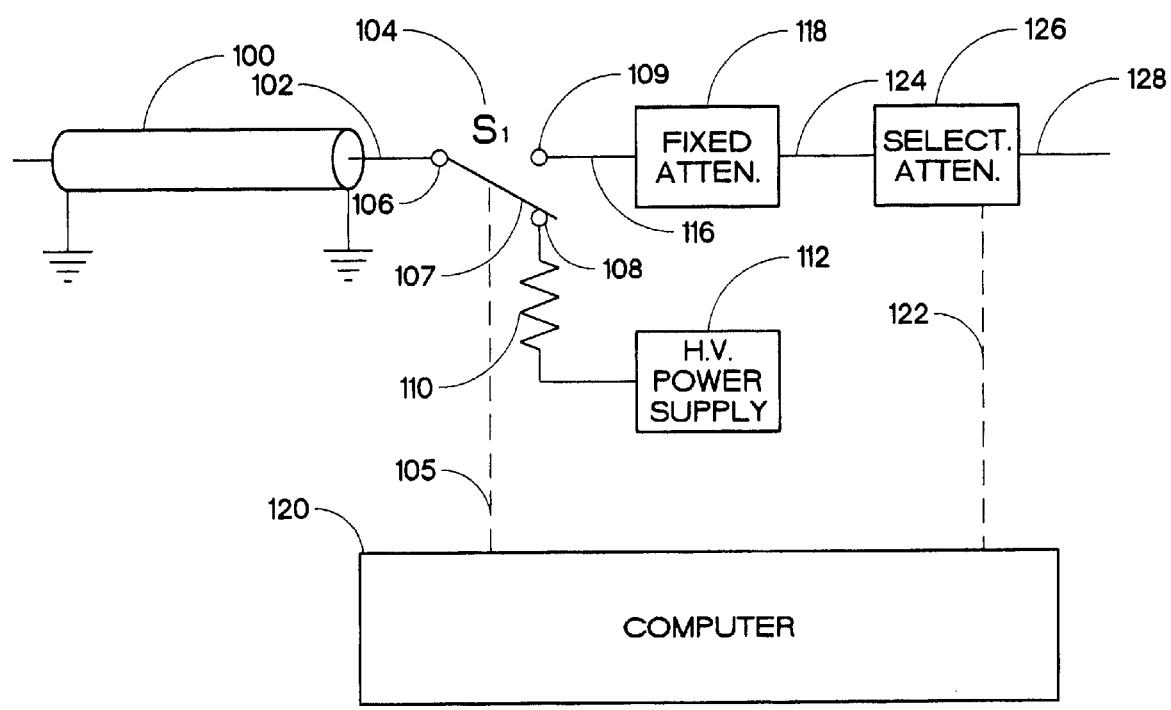
FIG._2

PULSE CIRCUIT

CROSS-REFERENCE TO RELATED APPLICATION

This application claims the benefit of U.S. Provisional Application, Ser. No. 60/131,630, filed Apr. 28, 1999.

BACKGROUND OF THE INVENTION

1. Field of the Invention

This invention is in the general field of pulse circuitry and, more particularly, relates to measurement of the effects of a pulse applied to a device under test.

2. Description of the Prior Art

Electrostatic Discharge (ESD) has long been recognized as a threat to integrated circuit devices. Whether generated through triboelectrification, induction or conduction, the discharge that occurs can contain several hundred nanojoules of energy and generate 3,000 V, enough to destroy all but the most robust semiconductor devices.

Large steps have been taken by the semiconductor industry towards reducing the ESD environment during fabrication in regard to parts handling techniques and in grounding technology and practices. The industry has also sought to address the problem by including ESD protective circuitry in the overall circuit design.

Efforts in regard to the latter approach have been hindered by the difficulty in testing such protective circuits, given the short time, high-current characteristics of ESD events (typically tens of nanoseconds and amps of current). Traditional laboratory equipment was incapable of simulating such electrical pulses, or accurately measuring the resultant circuit damage caused thereby. Without such feedback, it was difficulto assess the effectiveness of protective circuits as well as to develop improved circuits.

In a paper delivered at a 1985 ESD Symposium by Maloney and Khurana of Intel Corporation "Transmission Line Pulsing Techniques for Circuit Modeling," a different approach was proposed. Instead of attempting to simulate the complex waveforms of human body models, Maloney and Khurana proposed use of simple square pulses obtained from a charged transmission line. Known as Transmission Line Pulses (TLP), their use on the same time and current scale as ESD events was intended to provide a simple pulsed curve tracing system to measure the characteristic curve of ESD protection structures. As originally proposed, a diode and resistor placed at the open end of a charged coaxial line to absorb the pulse energy reflected from the Device Under Test (DUT).

Subsequent test equipment has used other methods to reduce reflected pulse energy from the DUT, including the placement of a 500-ohm resistor between the 50-ohm source and the DUT, which provided a constant current source. A 50 or 56-ohm resistor was placed at the end of the 50-ohm transmission line to terminate the part of the test pulse that did not flow through the 500-ohm resistor. In these test system designs, the current and voltage monitors would typically be located directly at the DUT for close-in measurements. U.S. Pat. No. 5,519,327 to Consiglio is an attempt to improve the pulse generator with additional switches, to prevent an incorrectly assumed impulse source occurring as a result of distributed capacitance between discharge switch contacts.

These present methods of pulse generation have been attempted without a clear understanding of the time domain techniques that must be used to produce pulses with sub-nanosecond nanosecond Gaussian-type risetimes. The techniques used for pulse measurements have suffered from similar technology limitations, resulting in measured data of limited accuracy.

For example, the method most often used to absorb reflected pulses places a diode and resistor at the open end of the charged line used to produce the rectangular pulse. Diodes have capacitance across them and are not "perfect" diodes. This capacitance causes measurement errors from imperfect pulses or reflections that are bypassed through the diode capacitance or is an artifact of the majority carrier lifetime.

Other problems are created by the reflections at lower voltages where the diode is not sufficiently forward-biased. The charging and discharging of a transmission line with long connections between the switches and the charged lines produces non-Gaussian, slow risetimes. Additional circuit complexities result from the existence of capacitance between the contacts of a discharge relay, which cause impulse discharges in addition to the desired rectangular pulse. Analyses of such pulse generation are questionable because of the difficulty in building and correctly analyzing time domain circuits.

Use of the series 500-ohm resistor to provide a constant current source and the shunt 50-ohm resistor most often used to minimize reflections from the variable impedance of the DUT are typically assembled with insufficient consideration of lead length (inductance), which distort fast pulse rise times. The commonly used resistors in the 50- to 500-ohm range have high voltage coefficients and are difficult to assemble without adding more distortion to fast pulses. The 500/50-ohm matching system also reduces the pulse amplitude available to the DUT to about 50% of the amplitude that is available by using a matched (coaxial) attenuator to reduce reflections from the DUT. Placing the current and voltage monitors directly at the DUT also adds parasitic inductance, resistance, and capacitance at the measurement location. Optimum compensation for these parasitic elements can not be provided for the very wide bandwidth measurements that is needed for controlled fast pulse rise times in this time domain system. The imperfections at different pulse heights to both the generated pulse and the measurement hardware provide less than optimum test data accuracy throughout the full testing amplitude range.

Without a controlled risetime, the threat to the DUT is under less control. Real Human Body Model (HBM) pulses have a relatively slow risetime of between 2 to at least 10 nanoseconds to an amplitude where "snapback" occurs. Slower rise time pulses allow the DUT snapback to go to significantly higher voltages than when faster risetime pulses are used. Applying higher voltages to the protection elements before the conductive structure of the protection turns on, places a higher voltage on the voltage-sensitive gate oxide. This is a closer simulation to actual HBM threat pulses. It is also a more severe test than when using faster risetime pulses that cause the protection structure to turn on at lower voltages with correspondingly lower threats to the gate oxide.

Consiglio in U.S. Pat. No. 5,519,327 recites an attempt to solve two "problems" with the prior TLP test equipment, and fails to understand that the first problem is, in fact, a non-existent problem. The Consiglio circuit attempts to reduce a short impulse that is claimed to be produced when the switch armature makes contact to the supply voltage contact, and causes a displacement current to flow in the opposite contact of the pulse-forming switch. The capacitance between the terminals of a SPDT switch are shielded by the armature and amount to a maximum of 0.5 pF. Such a discharge into a 50-ohm load has a 25-pS exponential fall time with an unspecified risetime. With a poorly designed transmission line circuit, the 25 pS impulse that might be formed with a poorly chosen switch would be smeared out and reduced to an unmeasurably low amplitude before it ever got to the DUT. Although the circuit disclosed in U.S. Pat. No. 5,519,327 does remove the resistance of the voltage probe from the leakage current measurement path, it is done with terminal 106 of switch S1 and terminal 152 of switch S3. They create a complex generating and reflecting structure from "T" type branched stubs that produce pulse distortions because it creates reflections of the test pulse before the pulse reaches the DUT.

It is also highly unlikely that the invention described in U.S. Pat. No. 5,519,327 actually operates as described, because when its S1 is closed, a very high DC potential is applied to terminals 122 and 123 of the scope 124. No oscilloscope can withstand such high voltages and if an undescribed voltage probe is used, its shunt resistance would decrease the voltage on the charge line by the voltage dividing effect of resistor 102 and the voltage probe resistance to ground. It would also begin to discharge the charge line 110, to some amount during the time when switch S1 opens and switch S2 closes.

Although simple in theory, attempting to use charged transmission lines to produce the faster rise times required for a complete range of controlled HBM simulation test pulse threats has resulted in the creation of unspecified and uncontrolled pulse rise times, producing undefined threats to the DUT. Substantial or minor multiple-reflections from the TLP-generating circuit decrease the possible accuracy of measurements over the complete range of voltage and currents. The 500/50-ohm-matching circuits do not produce currents high enough to produce an I/V curve trace up to and above the DUT failure level of well-designed ESD protection structures. While some existing home-made systems have reasonable measurement characteristics over lower pulse current limited ranges, no system has all the testing capabilities, inherent accuracy, and speed of testing required to elicit failure mode information from the ESD protective circuitry on the incremental basis required to obtain its complete characteristic curve.

SUMMARY OF THE INVENTION

An object of the present invention is to measure the effects of applying a pulse to a device under test.

According to the invention, a pulse generator provides a pulse that is applied to a device under test through a signal path that has a constant impedance along its entire length. A measurement is made of the voltage on the signal path and the current therethrough at a location remote from the device under test.

The current through the signal path in response to pulses of varying amplitudes is recorded and studied on a digital display to determine the effect of the application of the pulses on the device under test.

Other objects, features and advantages of the invention should be apparent from the following description of the preferred embodiment thereof as illustrated in the accompanying drawing.

BRIEF DESCRIPTION OF THE DRAWINGS

FIG. 1 is a schematic block diagram of the preferred embodiment of the invention; and FIG. 2 is a schematic block diagram of a pulse generator of FIG. 1.

DETAILED DESCRIPTION OF THE PREFERRED EMBODIMENTS

The present invention provides closely controlled rectangular pulses that are applied to an integrated circuit DUT to measure the voltage across the device, and the current through the device at many different amplitudes. Utilization of this invention allows test pulses to be generated at higher levels, with faster, controlled Gaussian-type risetimes, which can be applied to the DUT in a manner that allows more accurate measurements than has been previously possible.

In accordance with the present invention, the use of constant impedance throughout the measurement system is the fundamental requirement for undistorted, fast pulse generation, transmission, and measurement. Different impedances can be used in different parts of the system if an effort is made to have wide bandwidth matching where the impedance level is changed.

Impedance matching can be made with resistive or transformer techniques to minimize pulse distortion and maintain the test pulse risetime. In a presently preferred embodiment, maintaining a 50-ohm impedance throughout the system has been found to maintain a very high measurement accuracy. It is to be understood, of course, that the present invention could be used with other impedance levels, and the present invention is not to be viewed as limited to any specific impedance value.

Reference is now made to the drawing wherein like numerals refer to like parts throughout. As shown in FIG. 1, a pulse generator 99 has its output connected to a filter network 131 through a transmission line 128. Additionally, the pulse generator 99 is connected to a personal computer 120 through a control signal line 136. The pulse generator 99 provides a substantially rectangular pulse at its output in response to a signal from the computer 120. The characteristic impedance of the transmission line 128 substantially equals the output impedance of the pulse generator 99.

The filter network 131 includes a coaxial switch 134 that is connected to the computer 120 through a plurality of control signal lines 130. The switch 134 is additionally connected to a plurality of Gaussian low pass filters 133. The coaxial switch 134 is operable to cause a selected one or more of the filters 133 to be placed in series with the transmission line 128 in response to a signal from the computer 120. The filter network 131 is used to provide a pulse having an increased rise and fall time in response to the pulse provided by the pulse generator 99.

The impedance of the filter network 131 substantially equals the output impedance of the pulse generator 99. As explained hereinafter, the transmission line 128 and the filter network 131 form part of a signal path that has a constant impedance along its entire length.

The network 131 is connected to a coaxial voltage probe 141 through a coaxial transmission line 135. The characteristic impedance of the line 135 and the voltage probe 141 substantially equals the output impedance of the pulse generator 99.

The voltage probe 141 provides an analog output signal proportional to a voltage on the line 135. The output of the voltage probe 141 is connected to a digitizer 140 through a signal line 142.

The digitizer 140 is connected to the computer 120 through a control line 145 and a plurality of signal lines 146.

In response to a control signal provided by the computer 120, the digitizer 140 provides a digital signal representation of the voltage probe 141 output signal to the computer 120 where it is stored.

The voltage probe 141 is connected to a coaxial current probe 144 through a coaxial transmission line 143. The characteristic impedance of the line 143 and the current probe 144 substantially equals the output impedance of the pulse generator 99.

The current probe 144 provides an analog output signal proportional to a current through the line 143. The output of the current probe 144 is connected to the digitizer 140 through a signal line 148. In response to a control signal provided by the computer 120, the digitizer 140 provides a digital signal representation of the current probe 144 output signal to the computer 120 where it is stored.

The digital signal representations of the output signals of the probes 141, 144 may be used to provide a video display of a pulse data point having orthogonal coordinates proportional to the current and voltage along a signal path that includes the lines 135, 143. It should be understood that a curve comprised of a multiplicity of pulse data points may be displayed by varying the amplitude of the output of the pulse generator 99.

The current probe 144 is connected to a coaxial single pole double pole switch 162 at a contact 164 thereof through a coaxial transmission line 160. The characteristic impedance of the line 160 and the switch 162 substantially equals the output impedance of the pulse generator 99.

The switch 162 has a contact 165 that is connected to a source-measuring unit 154 that is more fully described hereinafter. Additionally, a pole 166 of the switch 162 is connected to a coaxial connector 169. The connection of the pole 166 to one of the contacts 164, 165 through a switch arm 167 is controlled by the computer 120 via a control line 163. When testing a wafer, the arm 167 is positioned for ohmic connection to the contact 164.

The pole 166 is connected to a coaxial connector 169 through a coaxial transmission line 168. The connector 169 is alternatively connected to a connector 170 or to a connector 180. When a device under test is a chip on a wafer the connector 169 is connected to the connector 170. When the device under test is a packaged integrated circuit, the connector 169 is connected to the connector 180.

The connector 170 is connected to a balun 172 at a coaxial terminal thereof through a transmission line 171.

Balanced terminals of the balun 172 are connected through a balanced transmission line 173 to a reversing switch 174. The reversing switch 174 is additionally connected to needles 200, 201 that are in contact with a chip 176 at pins 178, 179, respectively, thereof.

The lines 168, 171, 173 all have a characteristic impedance substantially equal to the output impedance of the pulse generator 99. From the description given hereinbefore, there is a substantially constant impedance along a signal path that connects the output of the pulse generator 99 to the chip 176.

The reversing switch 174 is manually thrown to reverse the polarity of a pulse applied to the pins 178, 179. It should be appreciated that the pins 178, 179 are microscopically close. Because of the closeness, the reversing switch is used to obviate a manual handling of the needles 200, 201.

The connector 180 is connected to a balun 182 at a coaxial input terminal thereof through a coaxial transmission line 181. Balanced terminals of the balun 172 are connected through a balanced transmission line 185 to an integrated circuit 189 mounted upon a pad 118. More particularly, the line 185 is connected to pins 186 of the integrated circuit 189.

The lines 181, 185 have a characteristic impedance substantially equal to the output impedance of the pulse generator 99. From the description given hereinbefore, there is a substantially constant impedance along a signal path that connects the output of the pulse generator 99 to the pins 186. Unlike the pins 178, 179, the pins 186 are sufficiently separated so that a reversal of polarity may be achieved manually without a reversing switch.

As shown in FIG. 2, the pulse generator 99 includes a transmission line 100 that has its shield grounded at both ends. A center conductor 102 of the line 100 is connected to a gas pressurized single pole double throw switch 104 at a pole 106 thereof.

The switch 104 includes contacts 108, 109 that are connected to a high voltage power supply 112 through a resistor 110 and to an attenuator 118 through a coaxial transmission line 116, respectively. An arm 107 of the switch 104 is positioned to connect one of the contacts 108, 109 to the pole 106 in response to a control signal from the computer 120 provided on a control line 105.

When the arm 107 connects the pole 106 to the contact 108, a voltage provided by the power supply 112 charges the line 100 through the resistor 110. When the arm 107 connects the pole 106 to the contact 109, the line 100 discharges, thereby providing a high voltage pulse to the attenuator 118.

Typically, the high voltage pulse is in excess of 500 volts because the switch 104 my not function properly at lower voltages. The high voltage pulse is attenuated to a working voltage level by the attenuator 118. It should be understood that the attenuator 118 attenuates a pulse reflected through the signal path from a device under test. When, for example, the attenuator 118 causes the reflected pulse to be attenuated by a factor of two, energy of the reflected pulse is reduced by a factor of four. Therefore, the attenuator 118 is important because causes a reduction in the amplitude and energy of reflected pulses.

The attenuator 118 has its output connected to a selectable value coaxial attenuator 126 through a coaxial transmission line 124. The attenuator 126 is additionally connected to the computer 120 through a control signal line 122. The attenuator 126 provides an attenuation in accordance with a control signal provided by the computer 120.

As shown in FIG. 1, the source measuring unit (SMU) 154 is connected to the computer 120 through a control signal line 150 and a plurality of signal lines 152. SMU 154 additionally has an input connected to ground.

When arm 167 is ohmicly connected to the contact 165, the SMU 154 provides a controlled voltage to the DUT 176 or 189. A leakage measurement is read by the computer 120, thereby measuring damage caused by pulses provided to the wafer pads 178, 179, or the packaged IC leads being tested. The SMU 154 is similar to an ohmmeter.

The SMU 154 is a DC leakage meter, and is preferably a Kiethley Model 487 picoammeter/voltage source, that applies a low voltage (typically 0.5 to 50.0 volts) to the two leads of the DUT. It measures the leakage current that flows in the DUT at that voltage before pulse testing begins and after each test pulse is applied to the DUT. The DC leakage current measured on typical DUT operating voltages can range from a few picoamps to a few milliamps, depending on its function and DC test voltage used.

Slower test pulses do not provide enough displacement currents to cause some ESD protection circuits to turn on at lower voltages; as is found with faster test pulses. Testing protection structures with different rise times therefore allows greater insight into the their dv/dt sensitivity.

ESD protection devices, that draw very low currents (picoamps) can be leakage tested at their operating voltage. Other DUT pins that draw substantial currents at the usual operating voltages can be DC leakage tested at lower voltages to provide higher sensitivity to gate oxide damage. When the ESD protection structures have low DC leakage currents of ten picoamps to one nanoamp, slight increases in the initial leakage currents are an excellent indication of damage produced by the previous test pulse.

Packaged integrated circuit products that are used as "line drivers" and produce milliamps of drive currents can have higher DC leakage currents and must be measured with a DC test voltage below one volt so lower leakage currents can provide higher sensitivity to damage. The goal of leakage current testing is to determine the test pulse current that produces a sufficient leakage current increase to identify when the ESD protection structure has been damaged.

The test pulse is connected to either a packaged IC device or a device that is still on the wafer. In either case, the two electrical connections to the DUT are electrically balanced. Maintaining an electrically balanced connection to pads on a wafer or the pins on a packaged IC minimizes errors caused by parasitic capacitance from the device to a common ground return path to the TLP system. The balun also keeps the currents flowing inside the unbalanced coax instead of traveling along the outside of the coax and be lost. The balun provides this common ground current isolation function to the test pulse on its way to the DUT and to that part of the pulse that returns to the current and voltage monitors after being reflected from the DUT.

Modern personal computers have sufficient memory and computing power to be able to use higher-level languages to completely control all the functions of this TLP test system. We presently use LabViewl software version 5.1 from National Instruments. It controls the V+to of the power supply to which the charge line is charged; the time when gas switch 104 is closed to produce the initial test pulse at coaxial cable 116; the switch able attenuator 126, which further adjusts the pulse amplitude; the rise time of the test pulse at the group of coaxial switches 131; and the time when the arm 167 of the single pole switch 162 is connected to the contact 165, permitting the SMU 154 to measure the leakage current of the DUT. As a result, the computer 120 is able to control the pulse amplitude, the time when the pulse is generated, the triggering of the digitizer 140 for measurements, the switching in/out of rise time filters, and the switching of the coaxial leakage switch and the SMU to make leakage measurements. The rapid operation of this complete sequence allows 10 pulses per minute to be made, speeding the TLP testing of each structure.

Finally, the pulse voltage (measured by the voltage probe 141), the current (measured by the current probe 144), and the DC leakage data (measured by the SMU 154) at each test pulse amplitude are downloaded from the digitizer 140 and SMU 154 to the PC 120. The program software automatically analyzes the data, stores it to disk, plots the data on the PC screen and dumps the plot to a printer, if a hard copy is desired for the present or past DUT tests (See Exhibit A). The device number or wafer, construction and test characteristics such as pulse rise time and pulse length are also stored with the test data. This combination of hardware and software, utilizing the test system of the present invention, allows a ten- to 100-fold increase in testing speed over the prior art.

As a presently preferred optional feature, the test system can be provided a coaxial HN connector at the end 101, of the transmission line 100 (not shown in the FIGURES.) so that additional charge lines can be connected and provide additional pulse lengths. The HN connector may be used to provide a coaxial connector with 5000 volt DC standoff capability. While a test pulse length of between 75 nanoseconds and 150 nanoseconds simulates the energy of HBM threats, shorter and longer pulses can be used for this and other testing.

The test system of the present invention permits measurement of the voltage and current anywhere on the waveform, typically these measurements are taken somewhere during the last half of the test pulse. This minimizes the effects of any parasitic inductance of the connections to the DUT, and is more likely to be able to measure the damage that occurs near the end of a test pulse.

The combined incident and reflected voltage waveform at the voltage sensor is a direct measurement of the voltage across the DUT. The combined incident and reflected current waveform at the current sensor is a direct measurement of the current flowing through the DUT.

By using a modern computer for the data analysis the series and shunt resistance losses can be measured, and compensated for. Measuring a short circuit and an open circuit provides the measured data needed to compensate the DUT measured data and provide an accurately calibrated pulse measurement system corrected for system losses. The measurement data corrected for the series and shunt system losses produces precise direct output of the precise DUT current and voltage data.

Our invention has been disclosed in terms of a preferred embodiment thereof, which provides an improved pulse circuit that is of great novelty and utility. Various changes, modifications, and alterations in the teachings of the present invention may be contemplated by those skilled in the art without departing from the intended spirit and scope thereof. It is intended that the present invention encompass such changes and modifications.

We claim:

1. Apparatus for measuring a pulse that is transmitted to and reflected from a device under test:

a pulse generator;

a signal path that connects the output of said pulse generator to the device under test, said signal path having a constant impedance along its entire length that substantially equals the output impedance of said generator;

a personal computer connected to said pulse generator, a substantially undistorted pulse being transmitted through said signal path by said pulse generator in response to a pulse timing signal provided by said computer;

a voltage measuring network that provides a digital signal representation of a signal voltage on said signal path in response to said pulse being transmitted; and a current measuring network that provides a digital signal representation of a signal current through said signal path in response to said pulse being transmitted.

2. In the apparatus of claim 1 wherein said voltage measuring network comprises:

a voltage probe coupled to said signal path, said voltage probe providing an analog signal representation of said signal voltage; and a digitizer connected to said voltage probe and to said computer, said digitizer providing said digital signal representation of said signal voltage to said computer where it is stored.

3. In the apparatus of claim 2 wherein said voltage probe is coupled at a location remote from said device under test.

4. In the apparatus of claim 2 wherein said current measuring network comprises a current probe coupled to said signal path and connected to said digitizer, said current probe providing to said digitizer an analog signal representation of said signal current, said digitizer providing said digital signal representation of said signal current to said computer where it is stored.

5. In the apparatus of claim 4 wherein said current probe is coupled at a location remote from said device under test.

6. In the apparatus of claim 4 additionally comprising a device that provides a visual display of a pulse data point having orthogonal coordinates proportional to said signal voltage and said signal current, respectively.

7. In the apparatus of claim 6 additionally comprising:
   a source measuring unit connected to said computer;
   a balun having its balanced terminals connected to said device under test;
   a switch that is connected to said computer, said switch being operable to connect a coaxial terminal of said balun to said source measuring unit and interrupt said signal path, said source measuring unit providing to said computer a digital signal representation of a DC voltage applied through said balun to said device under test and a digital signal representation of a DC current produced in response to said DC voltage.

8. The apparatus of claim 7 wherein said computer stores said digital signal representation of said DC voltage and said digital signal representation of said DC current, said device providing a visual display of a DC data point having orthogonal coordinates proportional to said DC voltage and said DC current, respectively.

9. The apparatus of claim 8 wherein said DC data point and said pulse data point are displayed simultaneously.

10. The apparatus of claim 1 additionally comprising a filter network connected in said signal path through a transmission line to the output of said pulse generator, said transmission line having a characteristic impedance substantially equal to said constant impedance.

11. The apparatus of claim 10 wherein said filter network comprises:
    a plurality of low pass Gaussian filters; and
    means for placing one or more of said filters in said signal path.

12. The apparatus of claim 11 wherein said means for placing is a coax switch connected to said computer.

13. The apparatus of claim 1 additionally comprising a balun in said signal path, balanced terminals of said balun being connected to said device under test.

14. The apparatus of claim 13 additionally comprising a reversing switch, said balun being connected to said device under test through said reversing switch.

15. The apparatus of claim 1 wherein said pulse generator comprises:
    a transmission line;
    an attenuation network;
    a DC power supply; and
    a switch connected to said transmission line, to said attenuator network, to the output of said DC power supply and to said computer, said switch being operable in response to a signal from said computer to connect the output of said DC power supply to said transmission line whereby said transmission line is charged and to connect said charged transmission line to said attenuation network.

16. The apparatus of claim 15 wherein said attenuator network comprises:
    a high voltage attenuator that provides a fixed attenuation of an applied voltage; and
    a step attenuator connected in series with said high voltage attenuator and connected to said controller, said step attenuator providing a selectable attenuation in response to a signal from said computer.

17. Apparatus for providing a pulse to a device under test, comprising:
    a transmission line;
    an attenuation network connected to the device under test through a signal path that has a substantially constant impedance along its entire length;
    means for charging said transmission line; and
    means for discharging said transmission line to produce a pulse that is applied to said attenuation network.

18. The apparatus of claim 17 wherein said charging means comprises:
    a DC power supply;
    a personal computer; and
    a switch that connects said power supply to said transmission line in response to a signal from said computer.

19. The apparatus of claim 18 additionally comprising means for measuring a voltage on said signal path and a current therethrough.

20. The apparatus of claim 19 wherein said measuring means comprises:
    a voltage probe coupled to said signal path, said voltage probe providing a signal proportional to said signal path voltage;
    a current probe coupled to said signal path, said current probe providing a signal proportional to said signal path current; and
    a digitizer connected to said computer and to said probes, said digitizer being operable to provide a digital signal representation of said signal path voltage and said signal path current.

21. The apparatus of claim 19 additionally comprising a filter network in said signal path intermediate to said measuring means and said attenuation network.

22. The apparatus of claim 21 wherein said filter network comprises:
    a plurality of Gaussian low pass filters; and
    means for placing a selected one or more of said filters in said signal path.

23. The apparatus of claim 22 wherein said means for placing is a coax switch connected to said computer.

24. The apparatus of claim 17 additionally comprising a balun that has its balanced terminals connected to the device under test.

25. The apparatus of claim 24 additionally comprising a reversing switch, said balun being connected to said device under test through said reversing switch.

26. The apparatus of claim 25 additionally comprising:
    a source measuring unit; and
    a switch that is operable to interrupt said signal path and connect said source measuring unit to said device under test through said balun and said reversing switch, said source measurement unit providing a signal representation of leakage current through said device under test in response to an application of a voltage.

* * * * *